United States Patent
Wu et al.

(10) Patent No.: US 10,510,563 B2
(45) Date of Patent: Dec. 17, 2019

(54) WAFER CARRIER ASSEMBLY

(71) Applicant: TAIWAN SEMICONDUCTOR MANUFACTURING COMPANY LTD., Hsinchu (TW)

(72) Inventors: Ming-Tung Wu, Hsinchu (TW); Hsun-Chung Kuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 671 days.

(21) Appl. No.: 15/130,108

(22) Filed: Apr. 15, 2016

(65) Prior Publication Data

US 2017/0301563 A1    Oct. 19, 2017

(51) Int. Cl.
*H01L 21/67*     (2006.01)
*H01L 21/687*    (2006.01)
*B24B 37/32*     (2012.01)

(52) U.S. Cl.
CPC ........ *H01L 21/67023* (2013.01); *B24B 37/32* (2013.01); *H01L 21/68735* (2013.01)

(58) Field of Classification Search
None
See application file for complete search history.

(56) References Cited

U.S. PATENT DOCUMENTS

| | | | | |
|---|---|---|---|---|
| 6,033,292 A * | 3/2000 | Inaba | ...................... | B24B 37/30 451/287 |
| 6,225,224 B1 * | 5/2001 | Pandey | .................. | B24B 37/04 438/692 |
| 6,435,949 B1 * | 8/2002 | Katsuoka | ................ | B24B 37/30 451/288 |
| 6,500,059 B2 * | 12/2002 | Chang | ................... | B24B 37/345 451/289 |
| 6,719,618 B2 * | 4/2004 | Homma | .................. | B24B 37/30 451/285 |
| 6,890,402 B2 * | 5/2005 | Gunji | ...................... | B24B 37/30 156/345.14 |
| 7,122,475 B2 * | 10/2006 | Hudson | ................... | B24B 37/04 438/692 |
| 7,527,271 B2 * | 5/2009 | Oh | .......................... | B24B 37/30 269/21 |
| 9,610,672 B2 * | 4/2017 | Oh | ........................ | B24B 37/107 |
| 2015/0133038 A1 * | 5/2015 | Yamaki | ................... | B24B 37/32 451/59 |
| 2017/0301563 A1 * | 10/2017 | Wu | ......................... | B24B 37/32 |
| 2018/0281151 A1 * | 10/2018 | Ramaswami | ........... | B24B 37/32 |

* cited by examiner

*Primary Examiner* — Sylvia MacArthur
(74) *Attorney, Agent, or Firm* — WPAT, P.C., Intellectual Property Attorneys; Anthony King (57) ABSTRACT

A wafer carrier assembly includes a wafer carrier and a fluid passage. The wafer carrier comprises a retainer ring confining a wafer accommodation space. The fluid passage is inside the wafer carrier. The fluid passage includes an inlet and at least an outlet to dispense fluid into the wafer accommodation space.

20 Claims, 8 Drawing Sheets

WAFER CARRIER ASSEMBLY

BACKGROUND

Fabrication of an integrated circuit device requires the formation of various layers including both conductive layers and dielectric layers over a wafer to form necessary components and interconnects. During the fabrication, removal of a certain layer or portions of a layer must be achieved in order to form various components and interconnects.

One of the techniques available for removal is chemical-mechanical polishing (CMP) in which the slurry is used along with a polishing pad. During CMP operations, the wafer is rotated with respect to the polishing pad at the presence of slurry, thereby polishing the surface of the overlying layer. The slurry, however, tends to spin off from the polishing pad before reaching the wafer, which reduces polishing effect. In addition, the slurry is introduced over the polishing pad by a slurry delivery arm, which is an extra tool requiring extra installation space.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another elements) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

As used herein, the term "wafer carrier assembly" refers to an assembly including a wafer carrier able to hold a substrate such as a wafer and to rotate the substrate, and a fluid passage able to provide fluid such as slurry, chemicals or water. The wafer carrier assembly is able to be integrated into an apparatus such as a polishing apparatus. For example, the polishing apparatus includes a chemical-mechanical polishing (CMP) apparatus, and the wafer carrier assembly can be operated in conjunction with a polishing pad to implement a CMP operation.

As used herein, the term "lineal passage" refers to a tube or a pipe in which all fluid is communicable. In some embodiments, the lineal passage has one inlet and one outlet. The term "lineal" does not limit to a straight tube or a straight pipe.

As used herein, the term "multi-lineal passage" refers to a tube or a pipe in which not all fluid is communicable. In some embodiments, the multi-lineal passage includes a plurality of manifolds or channels with smaller diameter in communication with a main tube with larger diameter. The fluid flow coming from the main tube is divided into a plurality of fluid flows and distributed to different locations.

In the present disclosure, a wafer carrier assembly including a built-in fluid passage is provided. The built-in fluid passage has an outlet proximal to the overlapping region between the wafer and the polishing pad and facing the center of the wafer such that the fluid can be dispensed between the wafer and the polishing pad. As such, the slurry dispersive distance between the outlet of the fluid passage and the wafer is reduced. Accordingly, polishing uniformity is enhanced, and slurry consumption is reduced. The wafer carrier assembly of the present disclosure has built-in slurry delivery passage, and thus no extra slurry delivery arm is required. Therefore, the costs, installation space and position adjustment of extra slurry delivery arm are not required.

In the present disclosure, a CMP apparatus including a wafer carrier assembly and a polishing wheel assembly is provided. The wafer carrier assembly includes a built-in slurry passage, which allows dispensing slurry inside the wafer carrier.

Figure 1:
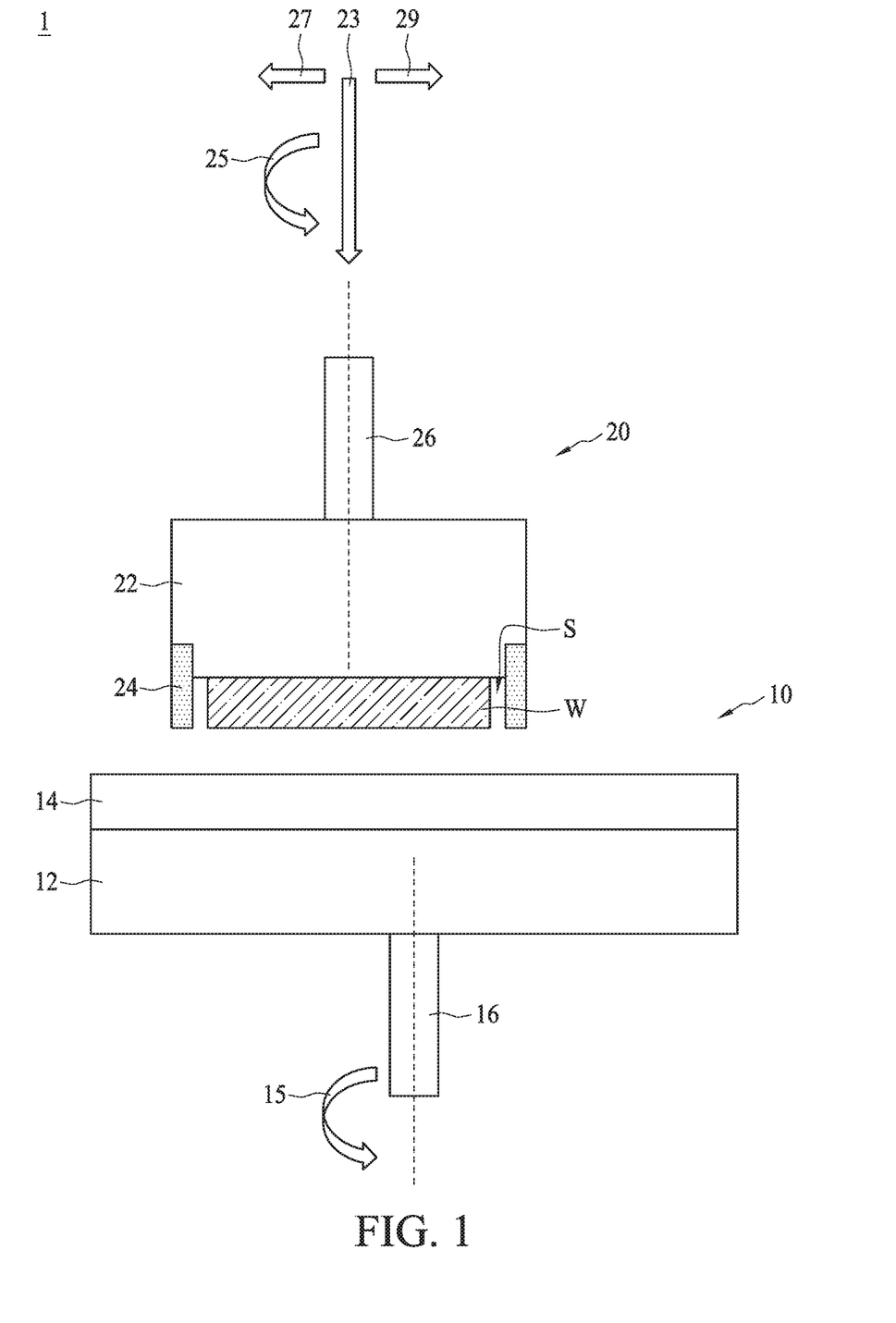
FIG. 1 is a schematic diagram of a CMP apparatus according to some embodiments of the present disclosure.
Figure 2:
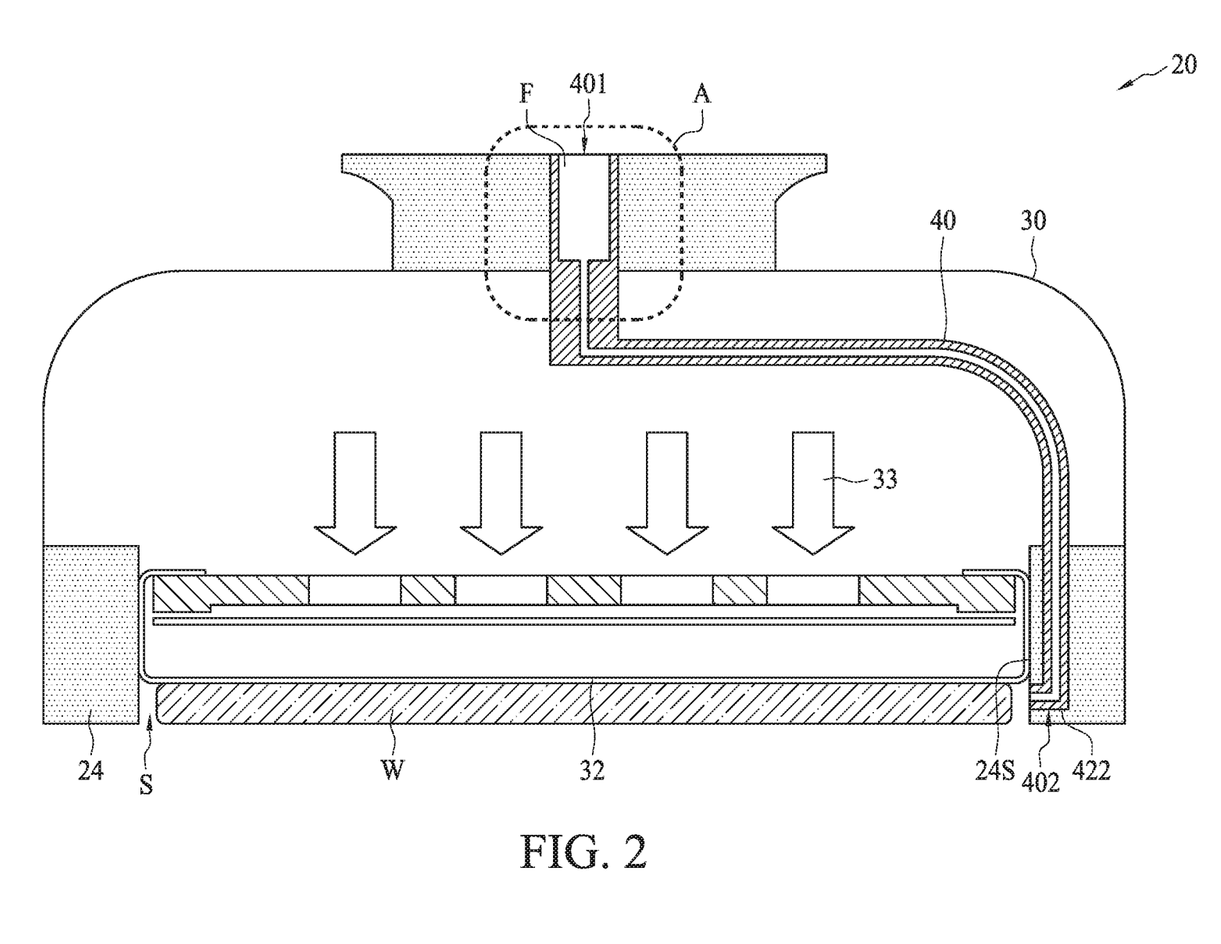
FIG. 2 is a schematic enlarged view of a wafer carrier assembly according to some embodiments of the present disclosure.

FIG. 1 is a schematic diagram of a CMP apparatus according to some embodiments of the present disclosure, and FIG. 2 is a schematic enlarged view of a wafer carrier assembly according to some embodiments of the present disclosure. As depicted in FIG. 1, the CMP apparatus 1 includes a polishing wheel assembly 10 and a wafer carrier assembly 20. The polishing wheel assembly 10 includes a polishing platen 12 and a polishing pad 14. The polishing platen 12 is coupled to a spindle (or a shaft) 16. The spindle 16 is able to be rotated by any suitable motor or driving means (not shown) in a direction indicated by arrow 15. The polishing pad 14 is attached on the polishing platen 12, and thus is able to be rotated along with the polishing platen 12. In some alternative embodiments, the polishing pad 14 is able to be moved in a linear direction, instead of being rotated.

The wafer carrier assembly 20 includes a wafer carrier 22 configured to hold or to grip a wafer W. The wafer carrier 22 is coupled to another spindle (or a shaft) 26. The spindle 26 is able to be rotated by any suitable motor or driving means (not shown) in a direction indicated by arrow 25 and moved in directions 27, 29. The rotation of the wafer carrier 22 and the rotation of the polishing platen 12 are independently controlled. The rotational direction of the wafer carrier 22 or the rotational direction of the polishing platen 12 can be clockwise or counterclockwise. The wafer carrier 22 further includes a retainer ring 24 confining a wafer accommodation space S to retain the wafer W to be polished. The retainer ring 24 is able to prevent the wafer W from sliding out from under the wafer carrier 22 as the wafer carrier 22 moves. In some embodiments, the retainer ring 24 has a ring-shaped structure. During CMP operation, the polishing pad 14 coupled to the polishing platen 12 and the wafer W retained by the retainer ring 24 are both rotated at appropriate rates. Meanwhile, the spindle 26 supports a load 23, which is exerted against the wafer carrier 22, and thus is exerted against the wafer W, thereby contacting the polishing pad 14. Thus, the wafer W or the overlying film (not shown) over the wafer W is polished.

As depicted in FIGS. 1 and 2, the wafer carrier 22 further includes a housing 30, and a pressure membrane 32. The pressure membrane 32 is configured to be lowered to press the wafer W during CMP operation so that the wafer W is in contact with the polishing pad 14. The pressure membrane 32 may also be configured to suck the wafer W during load-in and load-out operations. In some embodiments, the pressure membrane 32 is formed of flexible or resilient material, and can be driven to extend toward the wafer W or to shrink in a mechanical manner, a pneumatic manner or any suitable manners. In some embodiments, the pressure membrane 32 is able to be extended toward the wafer W by a pneumatic pressure as indicated by arrow 33. In some embodiments, the wafer W is gripped by the wafer carrier 22 through the pressure membrane 32. For example, the pneumatic pressure is provided by an air bladder. The flexibility of the pressure membrane 32 makes it possible to provide proper down force or sucking force on the wafer W, which helps to tune wafer thickness profile. The flexibility of the pressure membrane 32 also alleviates distortion of the wafer W when the pressure membrane 32 contacts the wafer W. In some embodiments, the pressure membrane 32 includes a plurality of portions that can be controlled individually so that different regions over the wafer W can be pressed or pulled by different pressures. Thus, better planarization uniformity of the wafer W in CMP operation is achieved. In some embodiments, sensor devices may be installed in the CMP apparatus 1 to detect polishing status of the wafer W at different locations of the wafer W. The detected signals can be delivered to a processor to adjust various parameters during CMP operation to improve polishing effect.

The wafer carrier assembly 20 further includes a fluid passage 40 built inside the wafer carrier 22. In some embodiments, the fluid passage 40 is rotated simultaneously with the wafer carrier assembly 20 under a same rotational speed. The fluid passage 40 is configured to deliver a fluid F. The fluid F may include slurry, water or any other fluidic liquid or gas. In some embodiments, the slurry may include an abrasive, an oxidizer, a corrosion inhibitor, chemicals, a liquid carrier and other necessary ingredients. The composition of the slurry may be modified based on the material of layer over the wafer W to be polished. The fluid passage 40 includes at least one inlet 401 and at least one outlet 402. The inlet 401 of the fluid passage 40 is coupled to a fluid reservoir (not shown). In some embodiments, a pump (not shown) is used to pump the fluid F from the fluid reservoir to the fluid passage 40 through the inlet 401. The fluid passage 40 is installed inside the wafer carrier 22, and the outlet 402 of the fluid passage 40 communicates with the wafer accommodation space S to supply the fluid F during CMP operation. In some embodiments, the outlet 402 of the fluid passage 40 is disposed proximal to a lateral edge of the wafer W to be polished and faced to the central of the wafer accommodation space S. Accordingly, the fluid F is able to enter the overlapping region between the wafer W and the polishing pad 14, and reaches the center region of the wafer W. In some embodiments, the outlet 402 of the fluid passage 40 is on an inner wall 24S of the retainer ring 24 and faces the center of the wafer accommodation space S. Accordingly, the center region and the edge region of the wafer W are polished more uniformly during CMP operation, which helps to improve profile uniformity of the layer over the wafer W.

In some embodiments, the spindle 26 (shown in FIG. 1) of the wafer carrier assembly 20 is a hollow spindle, and the inlet 401 of the fluid passage 40 is able to be installed in the hollow portion of the spindle 26.

In some embodiments, the fluid passage 40 is a lineal passage, but not limited thereto. In some embodiments, a portion of the fluid passage 40 is in embedded in the retainer ring 24, and the outlet 402 is exposed by the inner wall 24S of the retainer ring 24. In some embodiments, a spray nozzle (not shown) is installed or formed in the outlet 402 of the fluid passage 40 to pressurize the fluid F so that the fluid F can reach the center region of the wafer W easier.

Figure 3:
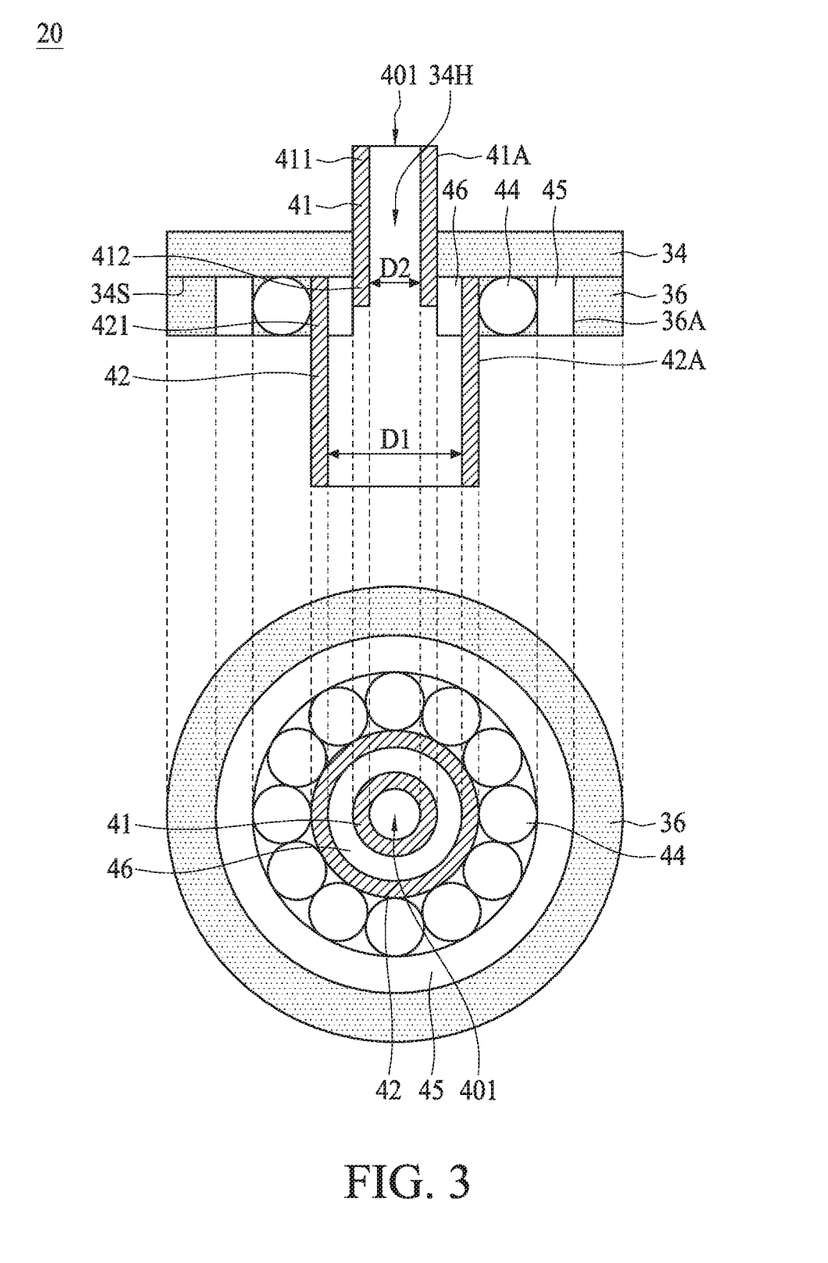
FIG. 3 illustrates a partially cross-sectional view and a partially top view of a wafer carrier assembly according to some embodiments of the present disclosure.

FIG. 3 illustrates a partially cross-sectional view and a partially top view of a wafer carrier assembly according to some embodiments of the present disclosure. FIG. 3 illustrates the partially cross-sectional view and top view of a region A of the wafer assembly carrier in FIG. 2. As depicted in FIGS. 2 and 3, the wafer carrier 22 further includes a plate 34 and a rim 36. In some embodiments, the plate 34 has a disc-like structure. The plate 34 has a bore 34H penetrating through the plate 34. In some embodiments, the bore 34H is formed at a symmetrical location of the plate 34. For example, the bore 34H is disposed at the center of the plate 34. The rim 36 surrounds a periphery of the plate 34. In some embodiments, the rim 36 has a ring-shaped structure. The rim 36 protrudes out from a surface 34S of the plate 34 toward the wafer W, thereby forming a space between the plate 34 and the rim 36. In some embodiments, the plate 34 and the rim 36 are two different structures coupled to each other. In some alternative embodiments, the plate 34 and the rim 36 are integrally formed.

In some embodiments, the fluid passage 40 includes a first tube 41 and a second tube 42 in communication with each other. The first tube 41 penetrates through the bore 34H of the plate 34. The first tube 41 has a first end 411 configured as the inlet 401 of the fluid passage 40, and a second end 412. The second tube 42 has a first end 421 and a second end 422. The first end 421 of the second tube 42 is in communication with the second end 412 of the first tube 41, and a second end 422 configured as the outlet 402 of the fluid passage 40. In some embodiments, a portion of the second tube 42 is embedded in the retainer ring 24, and the second end 422 of the second tube 42 is exposed by the inner wall 24S of the retainer ring 24. In some embodiments, the second tube 42 of the fluid passage is lineal.

In some embodiments, the first end 421 of the second tube 42 surrounds the second end 412 of the first tube 41, and the inner diameter D1 of the first end 421 of the second tube 42 is greater than the outer diameter D2 of the second end 412 of the first tube 41. This prevents backflow of the fluid F from the second tube 42 to the first tube 41, and also prevents the fluid F from leaking to the outside of the fluid passage 40. In order to prevent fluid leakage, a seal means (not shown) may be installed. In some embodiments, the diameter of the second end 422 of the second tube 42 is smaller than the diameter of the first end 421 of the second tube 42, thereby pressurizing the fluid F. It is appreciated that the diameter of the first tube 41 may be constant or may be different at different sections of the first tube 41, and the diameter of the second tube 42 may be constant or may be different at different sections of the second tube 42. The diameter of the first tube 41 or the second tube 42 may be modified based on various factors such as viscosity of the fluid F, flow rate of the fluid F, and other factors sensitive to polishing effect.

In some embodiments, the second tube 42 is rotatable with respect to the rim 36. In some embodiments, the wafer carrier assembly 20 further includes a first bearing 44 between the inner perimeter 36A of the rim 36 and the outer perimeter 42A of the first end 421 of the second tube 42. The first bearing 44 is configured to allow the second tube 42 rotating with respect to the rim 36 which is fixed on the plate 34. The first bearing 44 may include a roller bearing. The roller bearing includes a plurality of rollers accommodated between an inner ring and an outer ring, and confined by a cage. The roller of the roller bearing may include sphere ball roller, cylindrical roller, elliptical roller, pillared roller, ring-like roller, needle roller or any suitable rollers. The first bearing 44 may include any types of radial bearings which allow the second tube 42 to move in a radial direction with respect to the rim 36. In some embodiment, a ring structure 45 may be optionally fixed on the rim 36, and the first bearing 44 may be in contact with the ring structure 45. In some embodiments, the ring structure 45 may be the outer ring of the first bearing 44. In some embodiments, the first bearing 44 may be in contact with the rim 36 without disposing the ring structure 45.

In some embodiments, the second tube 42 is rotatable with respect to the first tube 41. In some embodiments, the second end 412 of the first tube 41 and the first end 421 of the second tube 42 may be in contact with each other as long as the friction therebetween is sufficiently low. In some embodiments, another ring structure 46 may be optionally fixed on the first tube 41 or on the second tube 42, and in contact with the other. In some embodiments, a sleeve 46 is disposed between the second end 412 of the first tube 41 and the first end 421 of the second tube 42 so that the second tube 42 is rotatable with respect to the first tube 41.

In some embodiments, the first tube 41, the plate 34 and the rim 36 are fixed, while the second tube 42 and the retainer ring 24 are rotated with respect to the plate 34 and the rim 36 during CMP operation.

The wafer carrier assembly of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4:
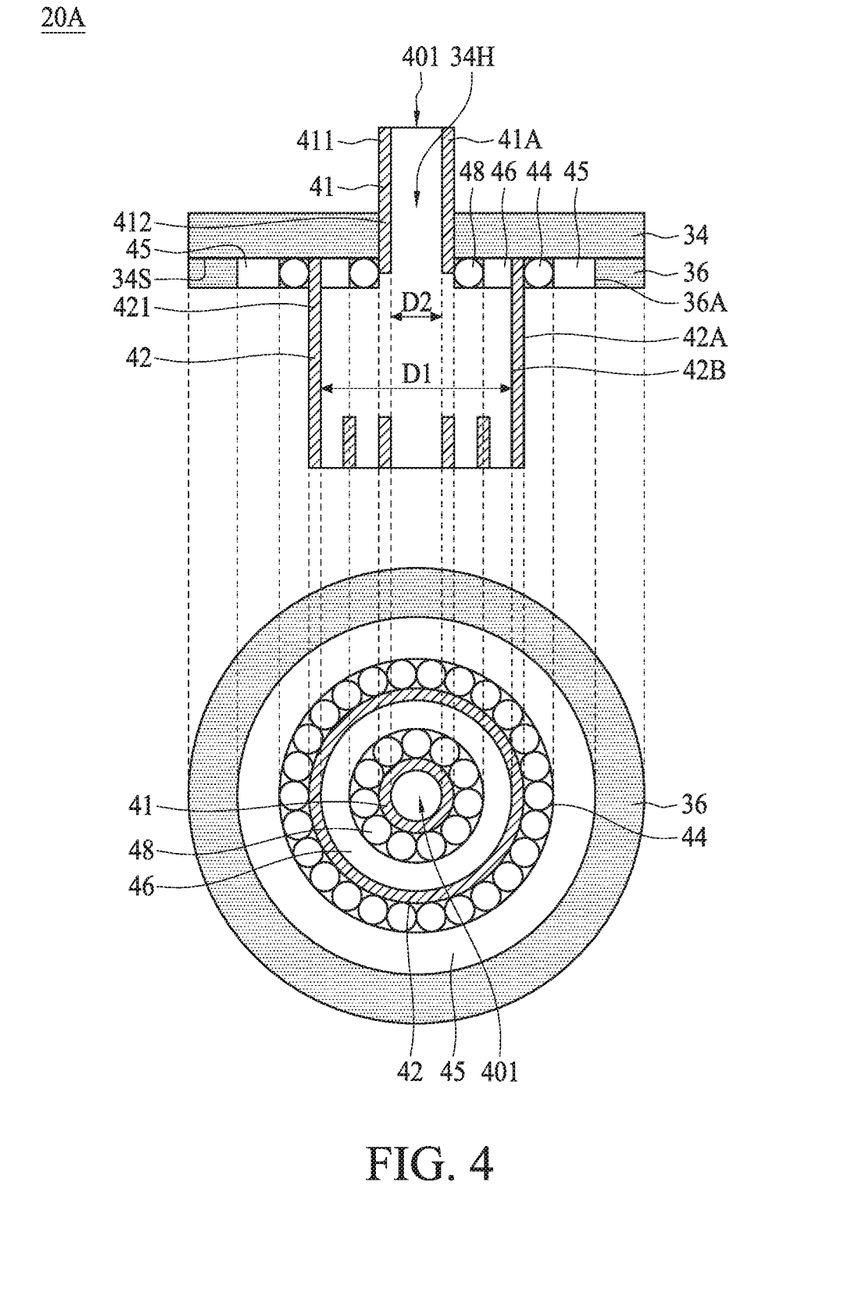
FIG. 4 illustrates a partially cross-sectional view and a partially top view of a wafer carrier assembly according to some embodiments of the present disclosure.

FIG. 4 illustrates a partially cross-sectional view and a partially top view of a wafer carrier assembly according to some embodiments of the present disclosure. As depicted in FIG. 4, different from the wafer carrier assembly 20 of FIG. 3, the wafer carrier assembly 20A further includes a second bearing 48 between the inner perimeter 42B of the first end 421 of the second tube 42 and the outer perimeter 41A of the second end 412 of the first tube 41. As such, the second tube 42 is rotatable with respect to the first tube 41. The second bearing 48 is configured to allow the second tube 42 rotating with respect to the first tube 41 which is fixed on the plate 34. The second bearing 48 may include a roller bearing. The roller bearing includes a plurality of rollers accommodated between an inner ring and an outer ring, and confined by a cage. The roller of the roller bearing may include sphere ball roller, cylindrical roller, elliptical roller, pillared roller, ring-like roller, needle roller or any suitable rollers. The second bearing 48 may include any types of radial bearings which allow the second tube 42 to move in a radial direction with respect to the first tube 41. In some embodiment, a ring structure 46 may be optionally fixed on second tube 42, and the second bearing 48 may be in contact with the ring structure 46. In some embodiments, the ring structure 46 may be the outer ring of the second bearing 48. In some embodiments, the second bearing 48 may be in contact with the second tube 42 without disposing the ring structure 46.

Figure 5:
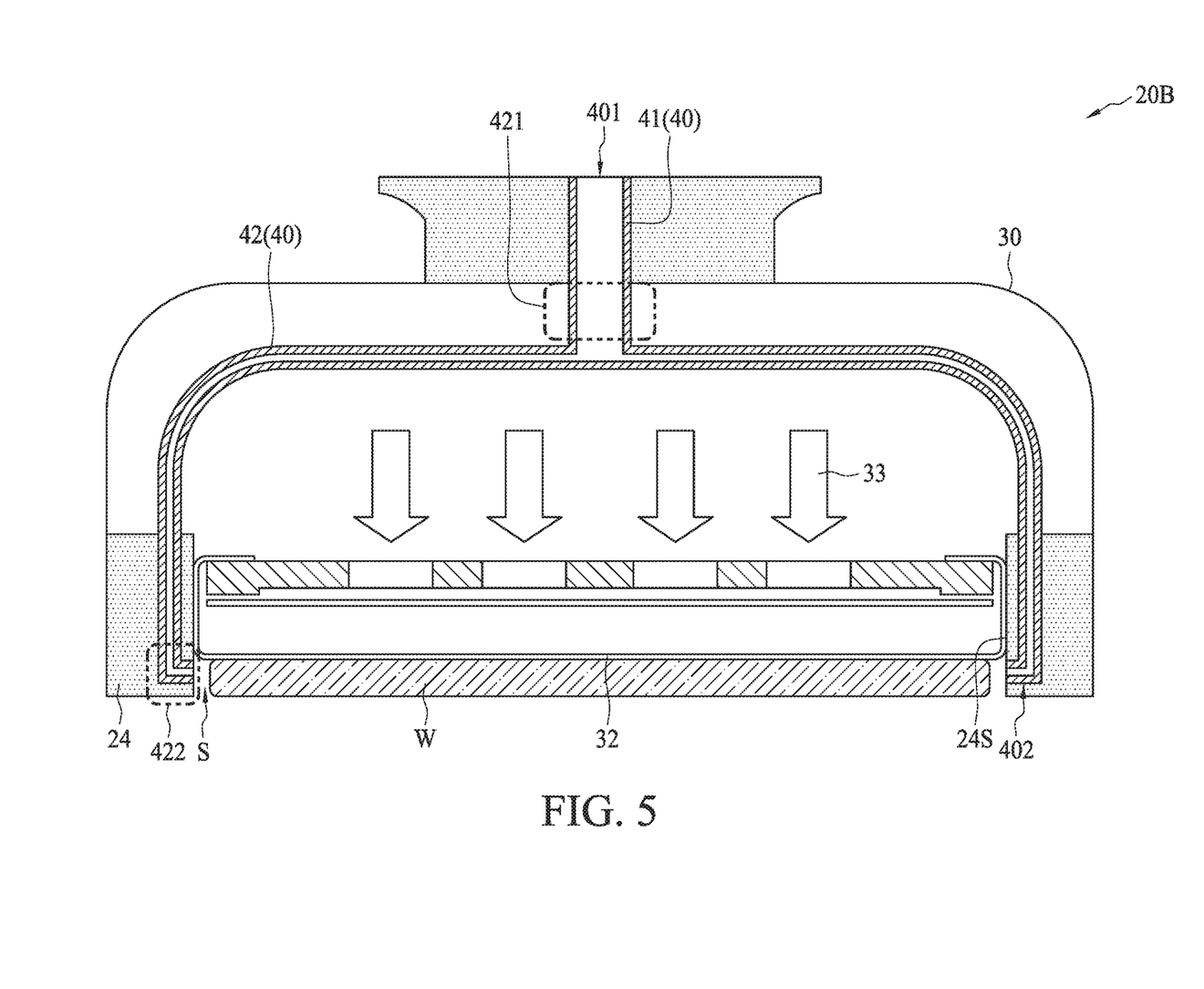
FIG. 5 is a schematic view of a wafer carrier assembly according to some embodiments of the present disclosure.
Figure 6:
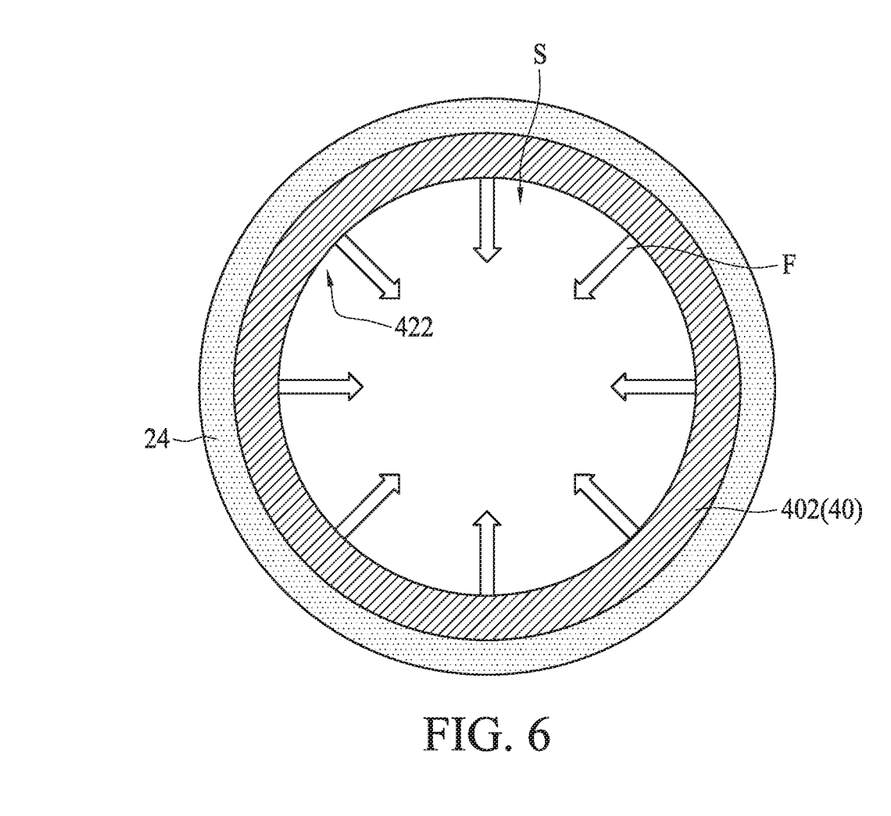
FIG. 6 is a schematic bottom view of a wafer carrier assembly according to some embodiments of the present disclosure.

FIG. 5 is a schematic view of a wafer carrier assembly according to some embodiments of the present disclosure, and FIG. 6 is a schematic bottom view of a wafer carrier assembly according to some embodiments of the present disclosure. As depicted in FIG. 5, different from the wafer carrier assembly 20 of FIG. 2, the second tube 42 of the wafer carrier assembly 20B is bell-shaped. In some embodiments, the bell-shaped second tube 42 is around the inside of the housing 30. The second tube 42 is extended through the retainer ring 24, and the second end 422 is exposed on the inner wall 24S and configured as the outlet 402 of the fluid passage 40.

As depicted in FIG. 6, the outlet 402 of the fluid passage 40 is a ring-shaped outlet surrounding the wafer accommodation space S. During CMP operation, the fluid F is dispensed from the outlet 402 of the fluid passage 40. As the outlet 402 of the fluid passage 40 is a ring-shaped outlet, the fluid F can be introduced into the wafer accommodation space S form all directions, and thus evenly dispersed between the wafer and the polishing pad. In addition, the outlet 402 of the fluid passage 40 faces the center of the wafer accommodation space S from a lateral direction, and thus the slurry can enter the center region of the wafer easier.

Figure 7:
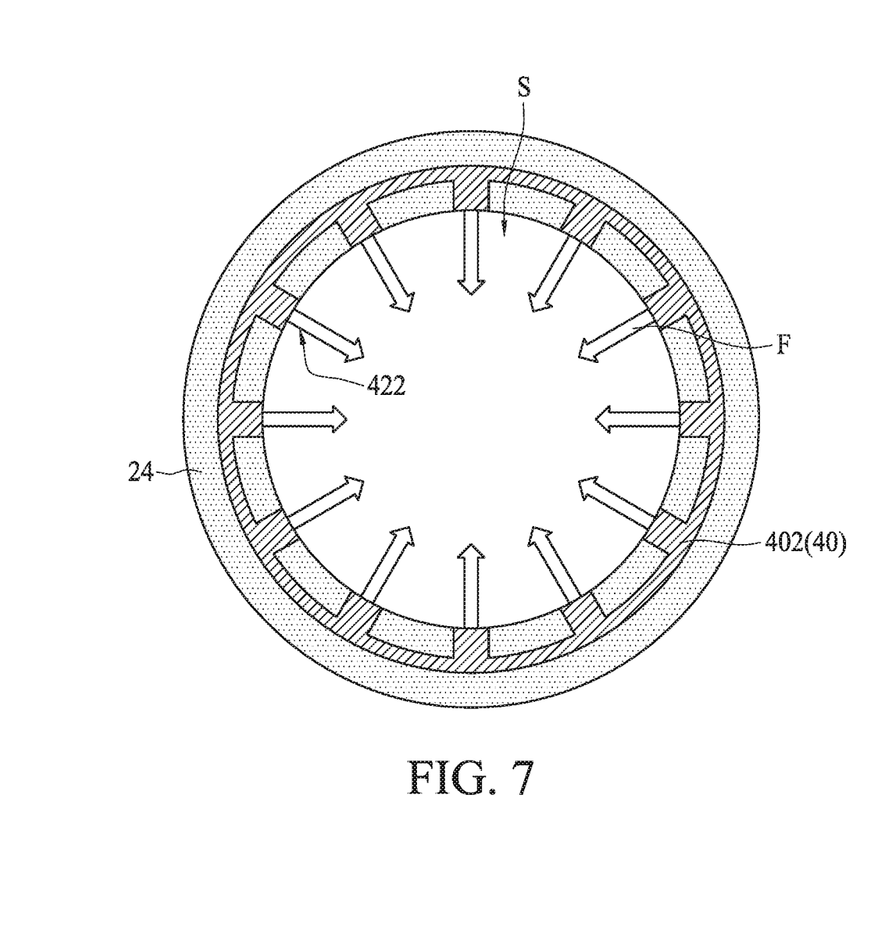
FIG. 7 is a schematic bottom view of a wafer carrier assembly according to some embodiments of the present disclosure.

FIG. 7 is a schematic bottom view of a wafer carrier assembly according to some embodiments of the present disclosure. As depicted in FIG. 7, the fluid passage 40 is a ring-shaped outlet surrounding the wafer accommodation space S, and the fluid passage 40 includes a plurality of outlets 402. During CMP operation, the fluid F is introduced from the outlets 402 of the fluid passage 40. As the outlets 402 of the fluid passage 40 are formed around the wafer accommodation space S, the fluid F can be introduced form various directions, and thus evenly dispersed around the wafer accommodation space S. In some embodiments, the outlets 402 of the fluid passage 40 are evenly disposed on the retainer ring 24. In addition, the outlets 402 of the fluid passage 40 face the center of the wafer accommodation space S from a lateral direction, and thus the slurry can enter the center region of the wafer easier. The number of the outlets 402 and the distance between adjacent outlets 402 may be modified to achieve better polishing effect.

Figure 8:
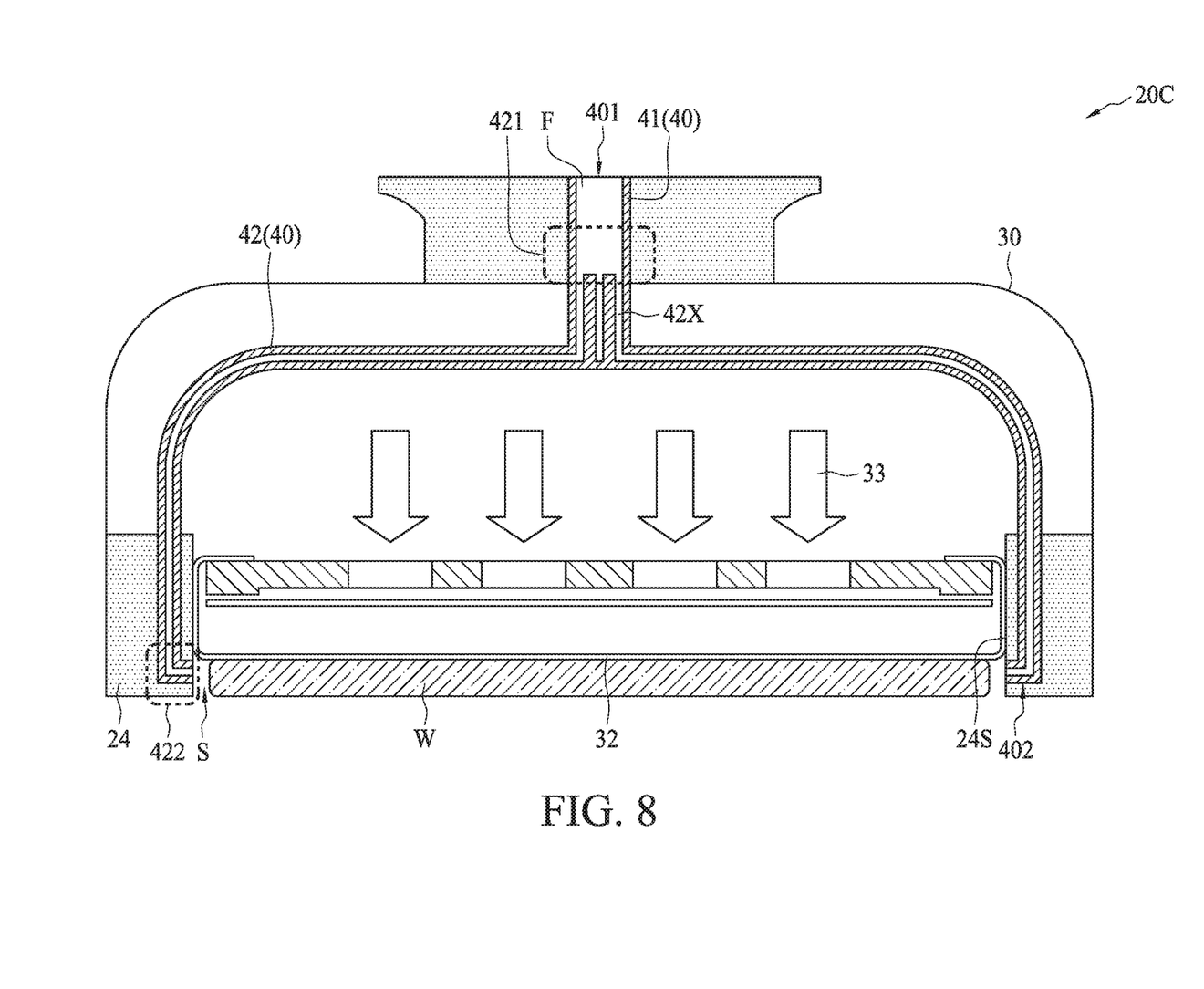
FIG. 8 is a schematic view of a wafer carrier assembly according to some embodiments of the present disclosure.

FIG. 8 is a schematic view of a wafer carrier assembly according to some embodiments of the present disclosure. As depicted in FIG. 8, different from the wafer carrier assembly 20 of FIG. 2, the second tube 42 of the wafer carrier assembly 20C is multi-lineal and has a plurality of outlets 402. In some embodiments, a portion of the second tube 42 proximal to the first end 421 is a main tube with a larger inner diameter, and another portion of the second tube 42 distal to the first end 421 is divided into a plurality of manifolds 42X with smaller inner diameter. In some embodiments, one end of each of the plurality of manifolds 42X with a smaller inner diameter is connected to the second tube 42. The manifolds 42X are extended through the retainer ring 24, and the other end of each of the manifolds 42X is configured as one of the outlets 402 to dispense the fluid F. As the outlets 402 of the fluid passage 40 are formed around the wafer accommodation space S, the fluid F can be introduced form various directions, and thus evenly distributed around the wafer accommodation space S. In some embodiments, the outlets 402 of the fluid passage 40 are evenly disposed on the retainer ring 24. The number of the outlets 402 and the distance between adjacent outlets 402 may be modified to achieve better polishing effect.

In the present disclosure, the wafer carrier assembly includes a wafer carrier and a slurry passage built in the wafer carrier. The slurry passage is formed inside the wafer carrier and the outlet(s) of the slurry passage is proximal to the wafer to be processed. Thus, the slurry dispersive distance is shorten, which can improve polishing uniformity. Also, slurry consumption is reduced.

In the present disclosure, the CMP apparatus includes a wafer carrier assembly and a polishing wheel assembly. The wafer carrier assembly has built-in slurry delivery passage, and thus no extra slurry delivery arm is required. Therefore, the costs, installation space and position adjustment of extra slurry delivery arm are not required.

In one exemplary aspect, a wafer carrier assembly is provided. The wafer carrier assembly includes a wafer carrier and a fluid passage. The wafer carrier comprises a retainer ring confining a wafer accommodation space. The fluid passage is inside the wafer carrier. The fluid passage includes an inlet, and at least an outlet to dispense fluid into the wafer accommodation space.

In another exemplary aspect, a wafer carrier assembly is provided. The wafer carrier assembly includes a wafer carrier, a slurry passage and a bearing. The wafer carrier comprises a plate having a bore through the plate, a rim surrounding a periphery of the plate, and a retainer ring confining a wafer accommodation space for retaining a wafer. The slurry passage is inside the wafer carrier and configured to deliver a slurry. The slurry passage comprises a first tube and a second tube. The first tube is through the bore of the plate and mounted on the plate. The first tube has a first end configured as an inlet of the slurry passage to receive the slurry. The second tube has a first end in communication with a second end of the first tube, and a second end configured as an outlet of the slurry passage. The first end of the second tube surrounds the second end of the first tube, and an inner diameter of first end of the second tube is greater than an outer diameter of the second end of the first tube. The bearing is between an inner perimeter of the rim and an outer perimeter of the first end of the second tube.

In yet another aspect, a wafer carrier assembly is provided. The wafer carrier assembly includes a wafer carrier, a slurry passage, a first bearing and a second bearing. The wafer carrier comprises a plate having a bore through the plate, a rim surrounding a periphery of the plate, and a retainer ring confining a wafer accommodation space for retaining a wafer. The slurry passage is inside the wafer carrier and configured to deliver a slurry. The slurry passage comprises a first tube and a second tube. The first tube is through the bore of the plate and mounted on the plate. The first tube has a first end configured as an inlet of the slurry passage to receive the slurry. The second tube has a first end in communication with a second end of the first tube, and a second end configured as an outlet of the slurry passage. The first end of the second tube surrounds the second end of the first tube, and an inner diameter of first end of the second tube is greater than an outer diameter of the second end of the first tube. The first bearing is between an inner perimeter of the rim and an outer perimeter of the first end of the second tube. The second bearing is between the inner perimeter of the first end of the second tube and the outer perimeter of the second end of the first tube.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer carrier assembly, comprising:
   a wafer carrier comprising a retainer ring confining a wafer accommodation space, a plate over the retainer ring, and a rim surrounding a periphery of the plate, wherein the plate has a bore through the plate; and
   a fluid passage inside the wafer carrier and configured to deliver a fluid, wherein the fluid passage includes an inlet, and at least an outlet to dispense the fluid into the wafer accommodation space, and wherein the fluid passage comprises a first tube through the bore of the plate, and a second tube under the plate and in communication with the first tube, the first tube has a first end configured as the inlet of the fluid passage, the second tube has a first end in communication with a second end of the first tube, and a second end configured as the outlet of the fluid passage, and the second tube is rotatable with respect to the rim and the first tube,
   wherein the first end of the second tube surrounds the second end of the first tube, and an inner diameter of the first end of the second tube is greater than an outer diameter of the second end of the first tube.

2. The wafer carrier assembly of claim 1, wherein the outlet of the fluid passage is on an inner wall of the retainer ring and faces a center of the wafer accommodation space.

3. The wafer carrier assembly of claim 1, wherein a portion of the second tube is embedded in the retainer ring.

4. The wafer carrier assembly of claim 1, wherein the second tube is lineal.

5. The wafer carrier assembly of claim 1, wherein the second tube is bell-shaped and has a plurality of outlets.

6. The wafer carrier assembly of claim 1, wherein the second tube is multi-lineal and has a plurality of outlets.

7. The wafer carrier assembly of claim 1, further comprising a first bearing between an inner perimeter of the rim and an outer perimeter of the first end of the second tube.

8. The wafer carrier assembly of claim 7, further comprising a second bearing between the inner perimeter of the first end of the second tube and the outer perimeter of the second end of the first tube.

9. The wafer carrier assembly of claim 8, wherein the first bearing and the second bearing comprise roller bearings.

10. The wafer carrier assembly of claim 1, wherein the first tube, the rim and the plate on fixed while the second tube is rotated with respect to the plate, the rim and the first tube.

11. The wafer carrier assembly of claim 1, wherein the fluid passage comprises a plurality of outlets evenly disposed on the retainer ring.

12. The wafer carrier assembly of claim 1, wherein the outlet of the fluid passage faces a center of the wafer accommodation space from a lateral direction.

13. A wafer carrier assembly, comprising:
a wafer carrier comprising:
a plate having a bore through the plate;
a rim surrounding a periphery of the plate; and
a retainer ring confining a wafer accommodation space for retaining a wafer;
a slurry passage inside the wafer carrier and configured to deliver a slurry, the slurry passage comprising:
a first tube through the bore of the plate and mounted on the plate, wherein the first tube has a first end configured as an inlet of the slurry passage to receive the slurry; and
a second tube having a first end in communication with a second end of the first tube, and a second end configured as an outlet of the slurry passage, wherein the first end of the second tube surrounds the second end of the first tube, and an inner diameter of first end of the second tube is greater than an outer diameter of the second end of the first tube; and
a bearing between an inner perimeter of the rim and an outer perimeter of the first end of the second tube.

14. The wafer carrier assembly of claim 13, wherein a portion of the second tube is embedded in the retainer ring.

15. The wafer carrier assembly of claim 13, wherein the outlet of the slurry passage is on an inner wall of the retainer ring and faces a center of the wafer accommodation space.

16. The wafer carrier assembly of claim 13, wherein the bearing comprises a roller bearing.

17. A wafer carrier assembly, comprising:
a wafer carrier comprising:
a plate having a bore through the plate;
a rim surrounding a periphery of the plate; and
a retainer ring confining a wafer accommodation space for retaining a wafer;
a slurry passage inside the wafer carrier and configured to deliver a slurry, the slurry passage comprising:
a first tube through the bore of the plate and mounted on the plate, wherein the first tube has a first end configured as an inlet of the slurry passage to receive the slurry; and
a second tube having a first end in communication with a second end of the first tube, and a second end configured as an outlet of the slurry passage, wherein the first end of the second tube surrounds the second end of the first tube, and an inner diameter of first end of the second tube is greater than an outer diameter of the second end of the first tube;
a first bearing between an inner perimeter of the rim and an outer perimeter of the first end of the second tube; and
a second bearing between the inner perimeter of the first end of the second tube and the outer perimeter of the second end of the first tube.

18. The wafer carrier assembly of claim 17, wherein a portion of the second tube is embedded in the retainer ring.

19. The wafer carrier assembly of claim 17, wherein the outlet of the slurry passage is on an inner wall of the retainer ring and faces a center of the wafer accommodation space.

20. The wafer carrier assembly of claim 17, wherein the first bearing and the second bearing comprise roller bearings.

* * * * *